(12) United States Patent
Staker et al.

(10) Patent No.: US 6,641,273 B1
(45) Date of Patent: Nov. 4, 2003

(54) MEMS STRUCTURE WITH MECHANICAL OVERDEFLECTION LIMITER

(75) Inventors: Bryan P. Staker, Pleasanton, CA (US); James P. Spallas, Dublin, CA (US); Lawrence P. Muray, Moraga, CA (US); Andres Fernandez, Dublin, CA (US)

(73) Assignee: Glimmerglass Networks, Inc., Hayward, CA (US)

( * ) Notice: Subject to any disclaimer, the term of this patent is extended or adjusted under 35 U.S.C. 154(b) by 0 days.

(21) Appl. No.: 10/186,566

(22) Filed: Jun. 28, 2002

(51) Int. Cl.[7] ................................................ G02B 7/182
(52) U.S. Cl. ..................... 359/876; 359/877; 359/224; 359/225
(58) Field of Search ................................ 359/876, 877, 359/224, 225, 226, 221, 220, 291, 872, 847, 298

(56) References Cited

U.S. PATENT DOCUMENTS

| 4,337,506 A | * | 6/1982 | Terada ........................ 362/142 |
| 4,598,585 A | * | 7/1986 | Boxenhorn ............... 73/504.12 |
| 4,721,274 A | * | 1/1988 | Erb .......................... 248/179.1 |
| 5,016,072 A | * | 5/1991 | Greiff .......................... 257/418 |
| 5,488,862 A | * | 2/1996 | Neukermans et al. ..... 73/504.02 |
| 5,648,618 A | * | 7/1997 | Neukermans et al. ..... 73/862.08 |
| 6,315,423 B1 | | 11/2001 | Yu et al. |
| 6,337,760 B1 | * | 1/2002 | Huibers et al. ............. 359/291 |
| 6,379,510 B1 | * | 4/2002 | Kane et al. ............ 204/192.34 |
| 2002/0012180 A1 | | 1/2002 | Yu et al. |

FOREIGN PATENT DOCUMENTS

WO 01/04680 A1 1/2001

* cited by examiner

*Primary Examiner*—Mohammad Sikder
(74) *Attorney, Agent, or Firm*—Townsend and Townsend and Crew LLP; Kenneth R. Allen

(57) ABSTRACT

A MEMS device having a fixed element and a movable element wherein one or the other of the fixed element and the movable element has at least one radially-extended stop or overdeflection limiter. A fixed overlayer plate forms an aperture. The aperture is sized to minimize vignetting and may be beveled on the margin. Overdeflection limitation occurs during deflection before the movable element can impinge on an underlying electrode. The overdeflection limiter may be conveniently placed adjacent a gimbaled hinge.

11 Claims, 6 Drawing Sheets

MEMS STRUCTURE WITH MECHANICAL OVERDEFLECTION LIMITER

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

This invention relates to electromechanical components such as micro electrical mechanical system (MEMS) devices or MEMS arrays and particularly to electrostatically-actuated electro-mechanical components wherein undesired deflection of movable elements due to nonlinear attractive effect may be controlled, preventing device failure. Components constructed according to the invention are MEMS mirror arrays or other micromachined elements.

Conventional MEMS array structures comprise Silicon on Insulator (SOI) array structures on which is fabricated an integrated electrode array. One of the problems encountered is device failure due to uncontrolled electrostatic deflection of the movable element of the device resulting in contact with the underlying substrate during operation due to over-voltage drive or inertial ringing of the device. Failure mechanisms include voltage breakdown, mechanical stiction or welding, and mechanical deformation of hinge elements. Anyone one of these failures can render a cell useless and severely hamper the usefulness of an array.

In a commonly-owned co-pending patent application Ser. No. 10/128,368 filed Apr. 23, 2002, the structure of a MEMS device is disclosed which employs a form of a stop based on the present invention. The co-pending application is not prior art to the present invention.

In U.S. Pat. No. 6,315,423 claiming a priority date of Jul. 13, 1999, one form of mechanical stop is disclosed for.a MEMS device which has high angles of displacement with highly compliant hinges. The travel stops therein are for overswing and x-axis shock protection, since the hinge design therein allows for large desired rotational motions as well as undesired multi-axis translational motions. Hence the travel stops therein are not one-dimensional stops.

A solution is needed that limits the maximum deflection of the MEMS device due to inherent electrostatic parallel plate instability without compromising device performance or manufacturability.

SUMMARY OF THE INVENTION

According to the invention, a MEMS device is provided having a fixed element and a movable element wherein one of the fixed element and the movable element has at least one radially-extended stop or overdeflection limiter. A fixed overlayer plate forms an aperture. The aperture is sized to minimize vignetting and may be beveled on the margin. Overdeflection limitation occurs during deflection before the movable element can impinge on an underlying electrode. The overdeflection limiter may be conveniently placed adjacent a gimbaled hinge.

The mechanical stop may be a plate mounted to the top of a conventional MEMS structure or integrated into a three layer MEMS structure or two two-layer MEMS structures combined. The invention will be better understood by reference to the following detailed description in connection with the accompanying illustrations.

DETAILED DESCRIPTION OF THE INVENTION

Figure 1:
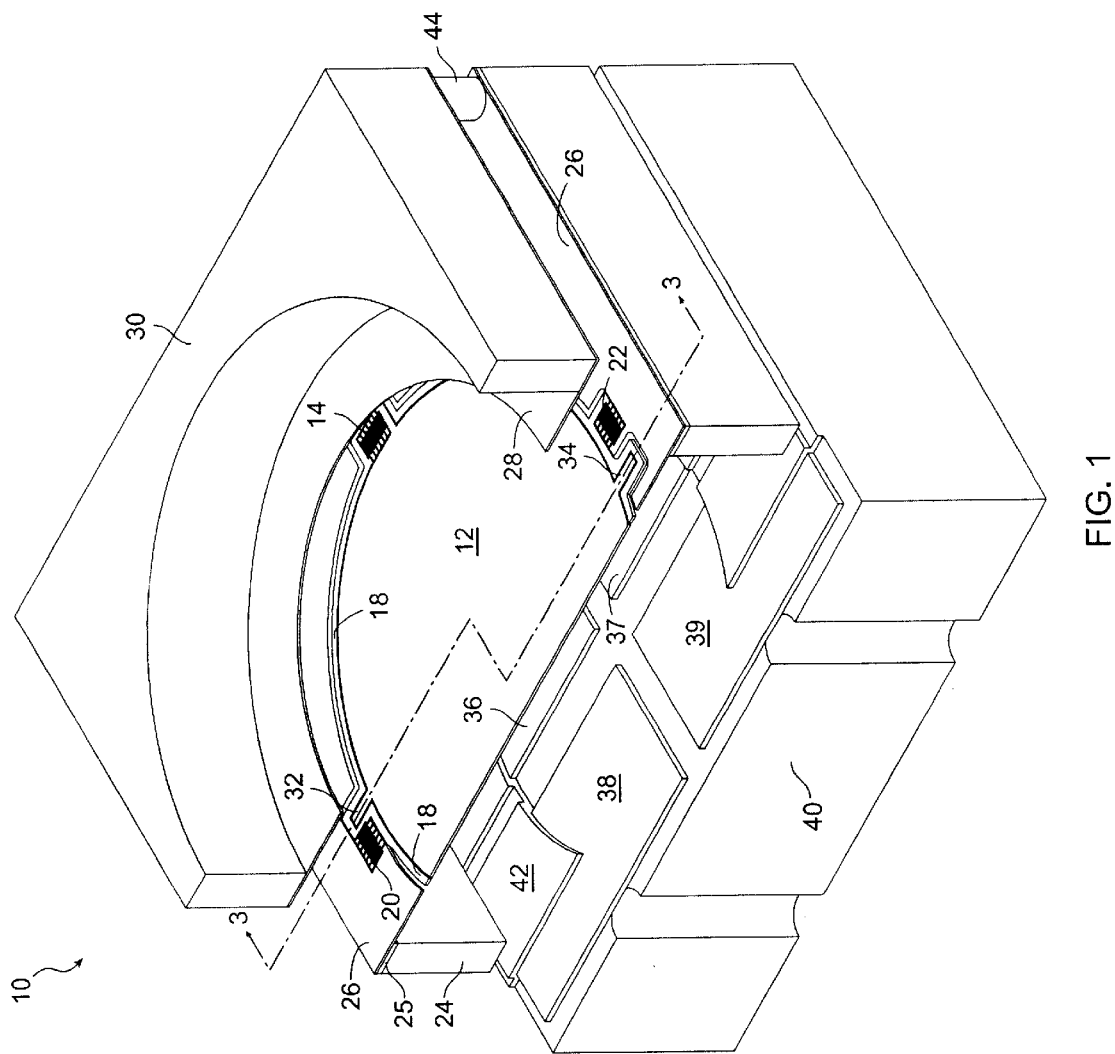
FIG. 1 is a perspective view in cutaway of a first embodiment according to the invention of a double-gimbaled mirror with a top mounted overhang stop layer.
Figure 7:
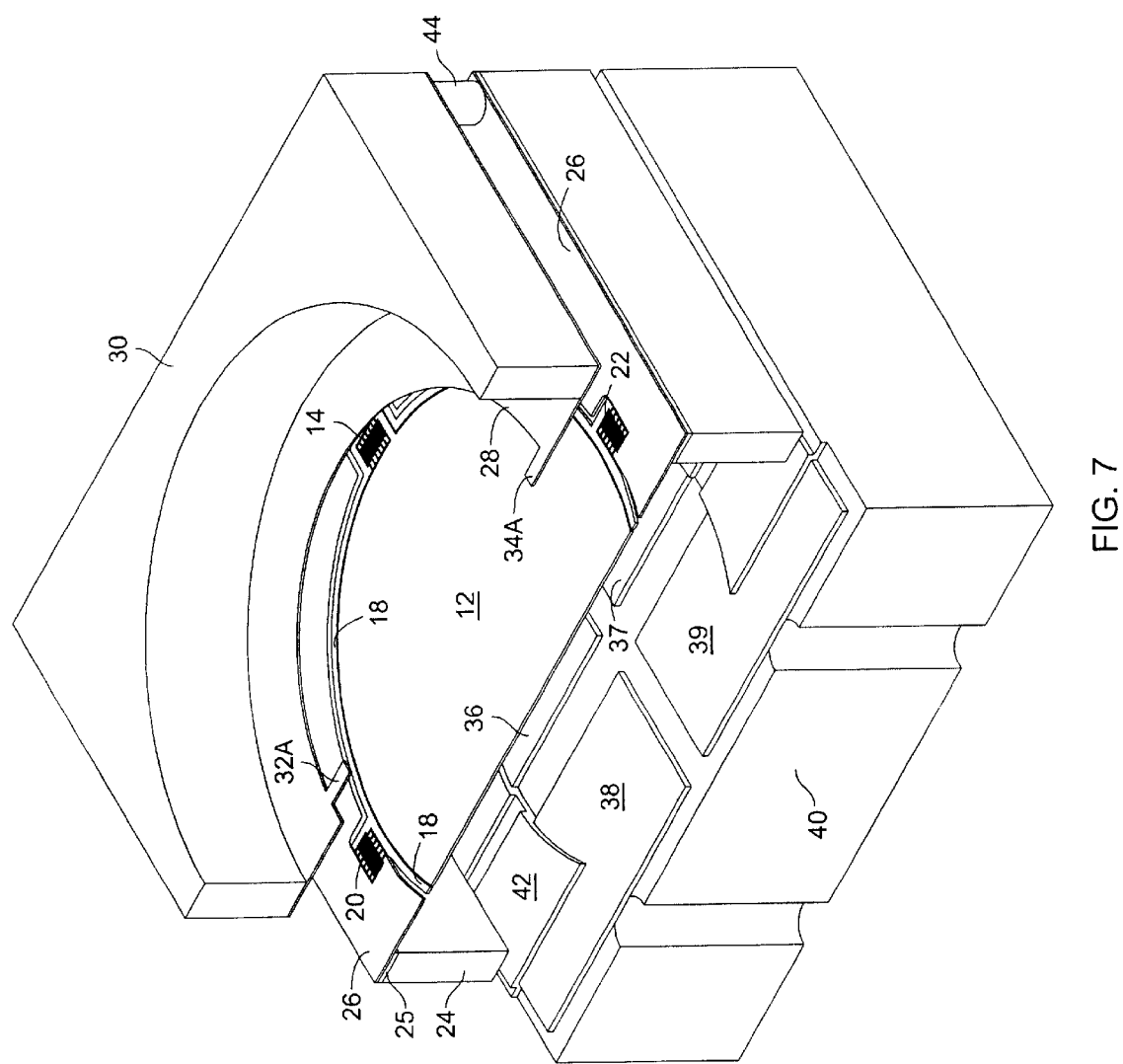
FIG. 7 is a perspective view in cutaway of a first embodiment according to the invention of a double-gimbaled mirror with a top mounted overhang stop layer.

Referring to FIG. 1 there is shown a perspective view in cutaway of a first embodiment of a single array element 10 of a MEMS array according to the invention. A mirror 12 is mounted on a first pair of hinges (FIG. 2) 14, 16 to a gimbal 18. The gimbal 18 is connected by a second pair of hinges 20, 22 having one degree of freedom to a frame 24, more particularly to a cantilever 26 of the frame 24 wherein an oxide layer 25 (FIG. 3) is provided for bonding and etch stop during manufacturing. The oxide layer 24 is typically on the order of only one micron thick. The nature of the frame construction is immaterial so long as it provides support. For example, surface micromachine processes and bulk micromachine processes can be employed to construct a frame without departing from the spirit and scope of the invention. According to the invention, an overhang 28 is provided which serves as a mechanical stop against rotation of the mirror 12. The overhang 28 is typically mounted above the mirror 12 (i.e., outside the electrode cavity) as part of a cap 30. In FIG. 1, tab extensions 32, 34 extend from the mirror 12 adjacent the second hinge pair 20, 22. Referring to FIG. 7, an alternative and less desirable embodiment employs tab extensions 32A, 34A which extend from the overhang 28 to encounter the edge of the mirror 12. While the tab extension allow for reduced mirror mass, they potentially vignette the beam to result in signal loss.

The frame 24 spaces the mirror from electrodes 36–39 mounted on a substrate 40. A dielectric 42 spaces the frame 24 from the substrate 40, and a plurality of standoffs 44, of which only one is shown in FIGS. 1 or 7) separate the cap 30 from the frame. Depending on the design of over-rotation sensors, the standoffs 44 can be either insulative or conductive. Insulative standoffs are useful if there is a circuit to be formed that senses contact between the mirror and the overhang indicating overdeflection. Conductive standoffs make it easier to construct a conductive cap 30, thus maintaining the mirror 12 and the cap 30 at equal potential.

Figure 2:
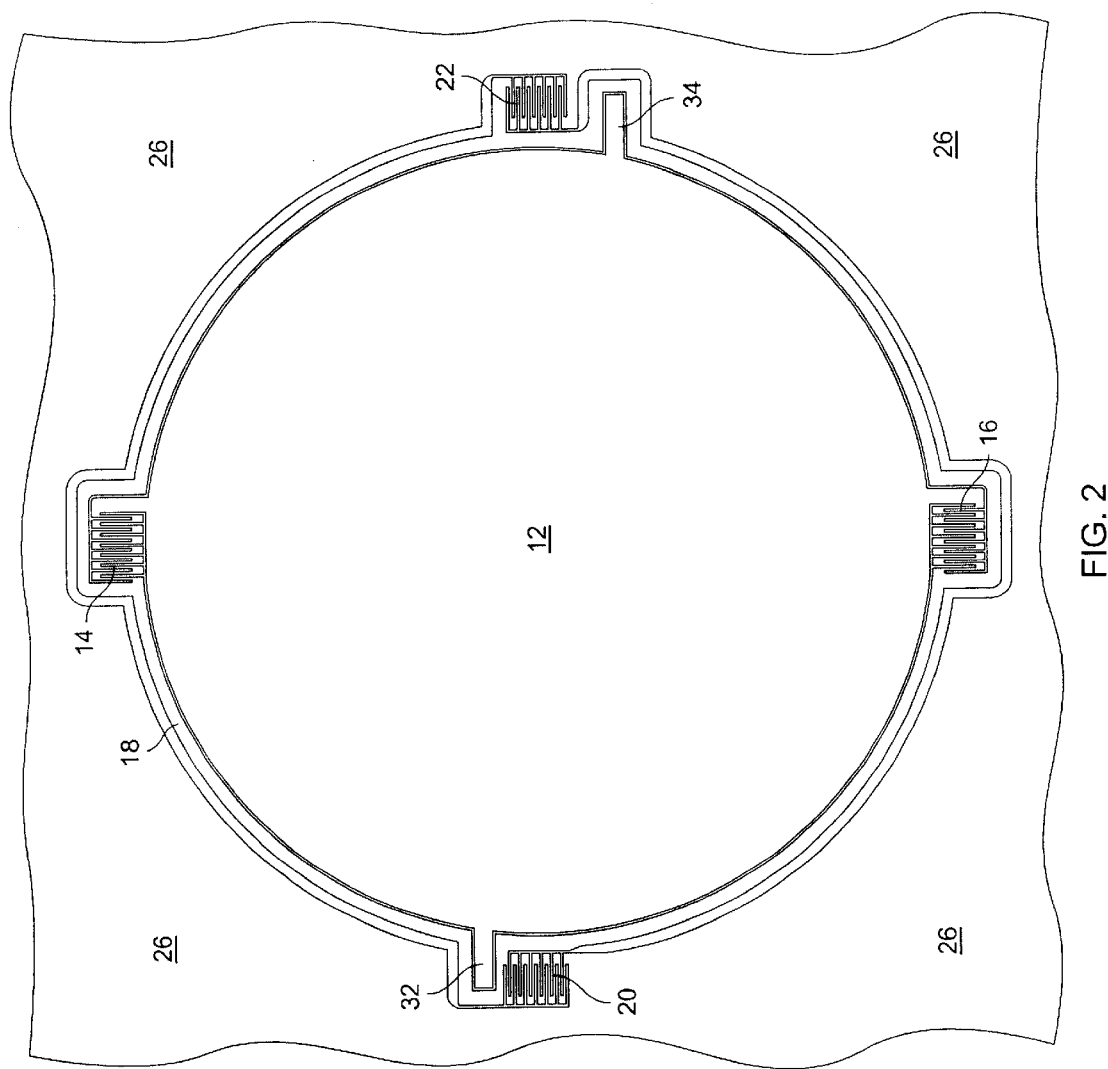
FIG. 2 is a top view of a double gimbaled mirror with mechanical stop tabs extending from the mirror.
Figure 3:
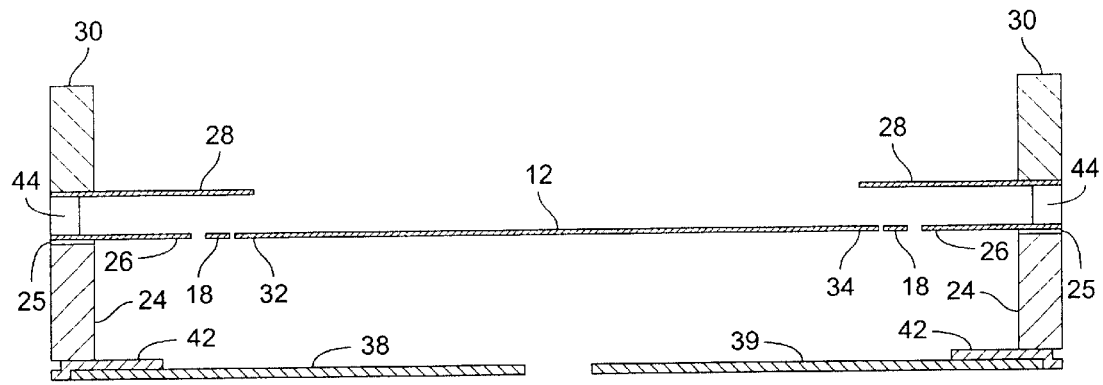
FIG. 3 is a side cross-sectional view of a single array element with a flipped SOI overhang mounted on a standoff.

FIG. 3 illustrates in cross section a view of FIG. 1 or 2 along sight line 3—3 through tabs 32, 34, gimbal 18 and cantilever 26. The overhang 28 is an aperture plate mounted on standoffs 44, which in this embodiment is a separately-formed layer formed on the cap 30. The cap 30 and overhang 28 are typically SOI structures (Silicon on Insulator where two different silicon layers are typically bonded together but separated by an oxide) which are "flipped" after fabrication and mounted by an appropriate adhesive such as an epoxy to standoffs 44, which could be cylinders, beads or the like. Alternatively, the top layer of the mirror 12 on its frame 24 could be etched to match a complementary cross etch in the mating face of the overhang 28 to assure accurate seating when beads are used as spacers. A KOH etch technique could be used wherein the crystal structures of the respective SOI chips are cross-ways to one another.

Figure 4:
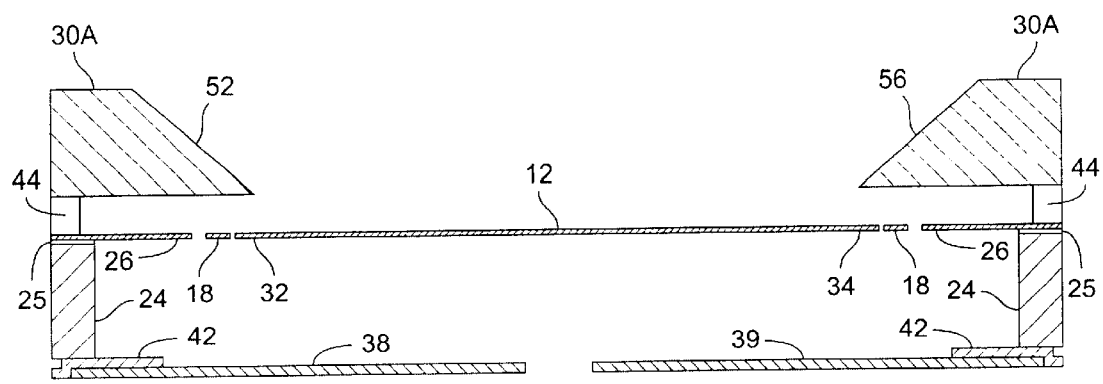
FIG. 4 is a side cross-sectional view of a single array element with an overhang formed in a single process step as a bevel.
Figure 5:
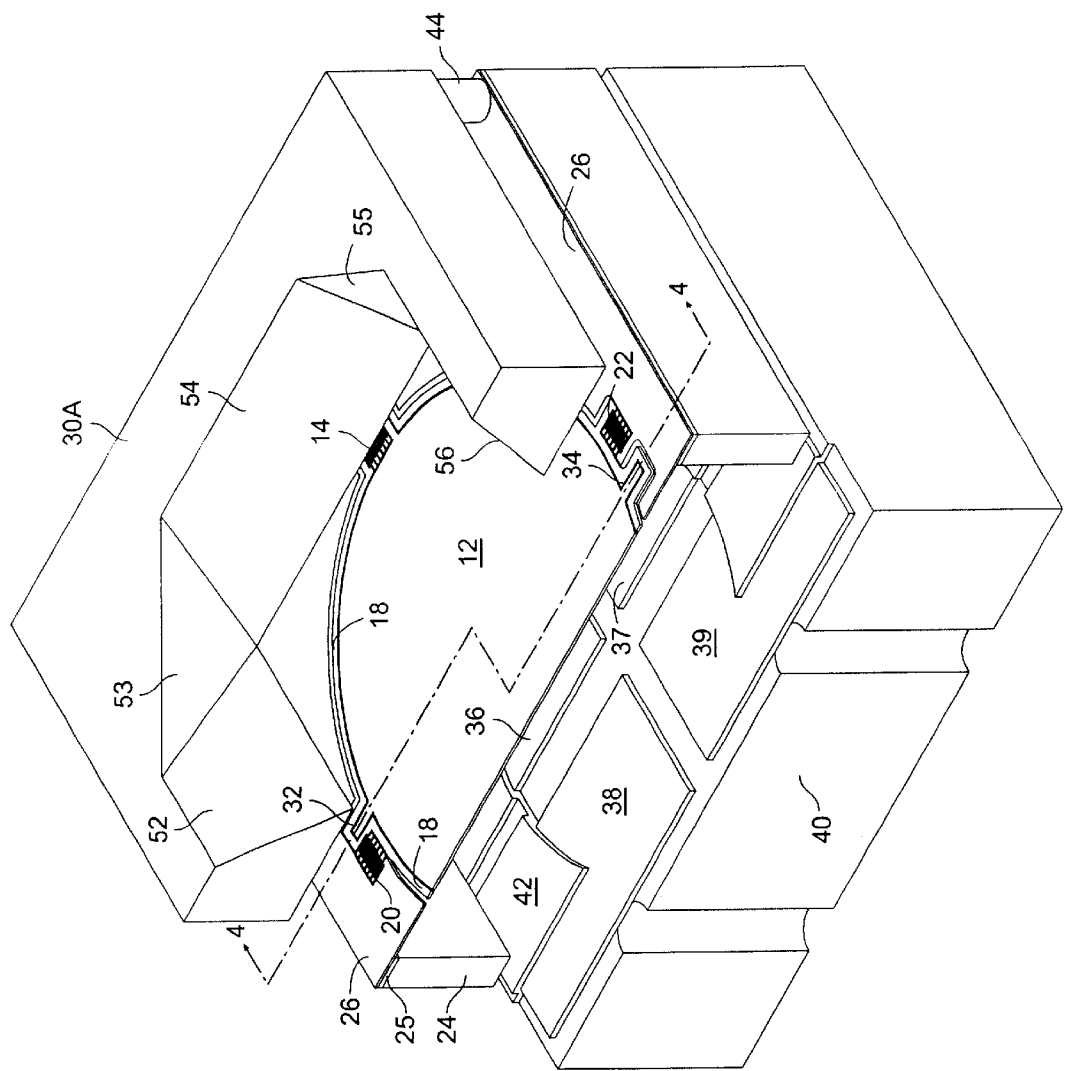
FIG. 5 is a perspective view of the element of FIG. 4.

FIG. 4 is a side cross-sectional view of a single array element along sight line 4—4 with a typical deep KOH etch along exposed crystal planes to form an aperture 30A. The aperture 30A (FIG. 5) is a rectangle with exposed facets 52–56, etc. It can be attached in the same manner as the structure of FIG. 3 with an appropriate adhesive to standoffs 44.

Flipped SOI has advantanges over conventional KOH fabrication of an aperture, since it permits relatively loose manufacturing tolerances of lithography, thus allowing the tabs 32, 34 to be reliably shorter. It should be noted, however, that polishing and spacing are critical to the required tolerances.

Figure 6:
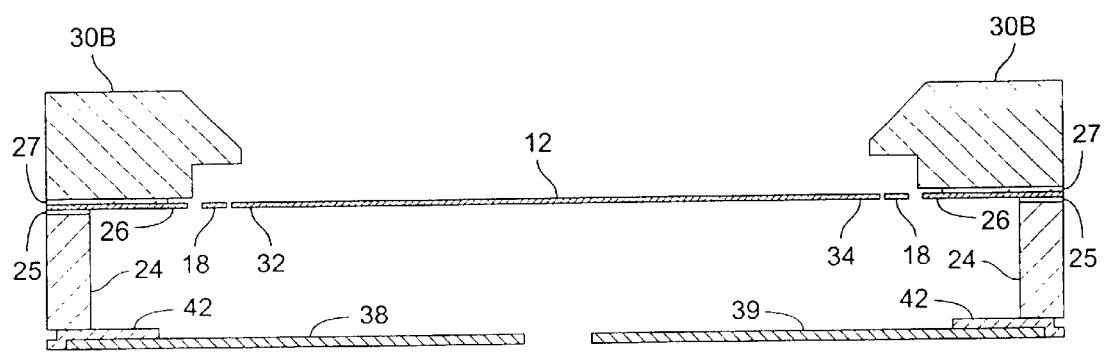
FIG. 6 is a side cross-sectional view of a single array element with an overhang of multiple bonded wafers.

FIG. 6 is a side cross-sectional view of a single array element with multiple bonds of SOI, so-called triple-stacked SOI. A dielectric 42 separates electrodes 38, 39 from the frame 40, and an oxide layer 25 is disposed between the frame 40 and the layer forming the mirror 12. A further oxide layer 27 is disposed between the layer of the mirror 12 and a further silicon cap 30, which in this case is step etched (before bonding) to form a shelf 31. The cap 30 is bonded to the layer of the mirror 12 at the oxide layer 27 after the oxidation and release step of the manufacturing process. This structure was disclosed but not claimed in a co-pending patent application which is not prior art. No extra assembly is required, since the triple SOI manufacturing step is an integrated process. However, it may be difficult to maintain isolation of mechanical stop layer from the stand-off layer due to the thin oxide.

The invention has been explained with reference to specific embodiments. Other embodiments will be evident to those of skill in the art. It is therefore not intended that this invention be limited, except as indicated by the appended claims.

What is claimed is:

1. A double-gimbaled micromachined mirror structure for parallel-plate electrostatic operation, said mirror structure comprising:
    a frame;
    a mirror;
    a gimbal around said mirror;
    a plurality of hinge structures at four positions on said gimbal, a first pair of said hinge structures connecting said mirror to said gimbal and a second pair of said hinge structures connecting said frame to said gimbal, said hinge structures permitting motion substantially only normal to said mirror and wherein adjacent each element of said first pair is a gimbal wraparound for serving as rotational displacement limitation; and
    overhanging structure adjacent each of said four positions and disposed to confront each said gimbal wraparound to limit rotational displacement of said mirror.

2. The apparatus according to claim 1 wherein said overhanging structure and said mirror are maintained in sufficient differential in potential to permit detection of contact of said substrate and said mirror through detection of voltage change.

3. The apparatus according to claim 1 wherein said overhanging structure and said mirror are maintained in sufficient differential in potential to permit detection of contact of said substrate and said mirror through detection of current change.

4. The apparatus according to claim 1 wherein said overhanging structure and said mirror are maintained in equipotential.

5. The apparatus a according to claim 1 wherein said detectable differential is sufficiently small to inhibit arcing upon contact between said mirror and said overhang.

6. The apparatus according to claim 1 wherein near each element of said second pair is a tab extension from said overhanging structure for serving as rotational displacement limitation on said mirror.

7. The apparatus according to claim 1 wherein said overhanging structure is disposed to provide a clear aperture at all design viewing angles of said mirror.

8. The apparatus according to claim 1 wherein said overhanging structure is disposed over said mirror and mounted on a flipped SOI handle structure.

9. The apparatus according to claim 1 wherein said overhanging structure is disposed over said mirror and formed in a bevel etched by potassium hydroxide.

10. The apparatus according to claim 1 wherein said overhanging structure is disposed over said mirror and formed of a thinned silicon wafer.

11. The apparatus according to claim 1 wherein said hinge structures are folded longitudinal gimbal hinge structures.

* * * * *